United States Patent
Miyajima et al.

(10) Patent No.: US 6,784,092 B2
(45) Date of Patent: Aug. 31, 2004

(54) METHOD OF FORMING INSULATING FILM AND METHOD OF MANUFACTURING SEMICONDUCTOR DEVICE

(75) Inventors: Hideshi Miyajima, Yokohama (JP); Miyoko Shimada, Yokohama (JP); Rempei Nakata, Kamakura (JP)

(73) Assignee: Kabushiki Kaisha Toshiba, Tokyo (JP)

(*) Notice: Subject to any disclaimer, the term of this patent is extended or adjusted under 35 U.S.C. 154(b) by 192 days.

(21) Appl. No.: 10/105,432

(22) Filed: Mar. 26, 2002

(65) Prior Publication Data

US 2002/0142623 A1 Oct. 3, 2002

(30) Foreign Application Priority Data

Mar. 29, 2001 (JP) ........................................ 2001-096678

(51) Int. Cl.⁷ ........................................ H01L 21/4763
(52) U.S. Cl. ........................ 438/623; 438/624; 438/637; 438/638; 438/687; 438/780; 438/781; 438/782; 438/787; 438/788; 438/789; 438/790
(58) Field of Search ................................ 438/623–624, 438/637–638, 687, 780–782, 787–790

(56) References Cited

U.S. PATENT DOCUMENTS 5,989,983 A 11/1999 Goo et al.
6,093,636 A * 7/2000 Carter et al. ................. 438/623
6,287,955 B1 * 9/2001 Wang et al. ................. 438/623
6,498,399 B2 * 12/2002 Chung et al. ................ 438/638
2002/0052125 A1 * 5/2002 Shaffer, II et al. .......... 438/780
2002/0123240 A1 * 9/2002 Gallagher et al. ........... 438/781

FOREIGN PATENT DOCUMENTS

JP 11-506872 6/1999

OTHER PUBLICATIONS

Kurosawa, T., et al., "Composition For Film, Method of Film Formation, and Insulating Film", U.S. Application Ser. No.: 09/670,547, filed on Sep. 27, 2000.

Shimada, M., et al., "Method of Manufacturing Semiconductor Device", U.S. Application Ser. No. 09/985,003, filed on Oct. 19,2001.

* cited by examiner

*Primary Examiner*—Lynne Gurley
(74) *Attorney, Agent, or Firm*—Finnegan, Henderson, Farabow, Garrett & Dunner, L.L.P.

(57) ABSTRACT

Disclosed is a method for forming an insulating layer, including coating a substrate with an insulating film material to form a coated film, the insulating film material containing at least first and second polymers differing from each other in average molecular weight, and heating the coated film while irradiating the coated film with an electron beam.

21 Claims, 2 Drawing Sheets

METHOD OF FORMING INSULATING FILM AND METHOD OF MANUFACTURING SEMICONDUCTOR DEVICE

CROSS-REFERENCE TO RELATED APPLICATIONS

This application is based upon and claims the benefit of priority from the prior Japanese Patent Application No. 2001-096678, filed Mar. 29, 2001, the entire contents of which are incorporated herein by reference.

BACKGROUND OF THE INVENTION

1. Field of the Invention

The present invention relates to a method of forming an insulating film and a method of manufacturing a semiconductor device, particularly, to a method of manufacturing an interlayer insulating film having a low dielectric constant and a method of manufacturing a semiconductor device comprising the particular interlayer insulating film.

2. Description of the Related Art

In previous years, wiring layer included in a semiconductor device was mainly a single layer structure. However, a multi-layered wiring structure has come to be widely used in recent years in accordance with progress in the miniaturization and operating speed of semiconductor devices. As a matter of fact, semiconductor devices having metal wiring structures including as many as five or more layers have been developed and manufactured. However, a delay in the signal transmission, caused by a so-called "parasitic capacitance between the adjacent wiring layers" and the wiring resistance, has become prominent as a serious problem impeding progress in miniaturization of semiconductor devices. More specifically, the problem is growing, in that the delay in the signal transmission caused by the increase in the number of layers included in the multi-layered wiring structure impairs the increase in operating speed of the semiconductor device.

To date, various measures have been taken in order to avoid the delay in the signal transmission caused by use of-the multi-layered wiring structure. In general, delay in the signal transmission can be represented by the product of the parasitic capacitance between the adjacent wiring layers, noted above, and the wiring resistance. In order to improve delay in the signal transmission, it is desirable to decrease the parasitic capacitance between the adjacent wiring layers, and the wiring resistance.

For decreasing the wiring resistance, changes in the main component of the wiring material to a material having a lower resistivity have been attempted. For example, changing from conventional aluminum wiring to copper wiring has been attempted. However, it is difficult to process a copper layer into the shape of a wiring by dry etching as used in the preparation of conventional aluminum wiring. Therefore, when using copper for forming a wiring, a buried wiring structure is employed.

Also, in order to decrease the parasitic capacitance between the adjacent wiring layers, it has been attempted to form an insulating film by CVD, containing SiOF as a main component, in place of the conventional method of forming an insulating film containing $SiO_2$ as the main component. It has also been attempted to form a so-called "SOG" (Spin on Glass) film having a relative dielectric constant lower than that of a $SiO_2$ insulating film, or an insulating film having a low dielectric constant such as an organic resin film formed by a spin coating method.

In general, the lower limit of the relative dielectric constant of the $SiO_2$ film used widely in the past is said to be about 3.9. On the other hand, it may be possible to lower the relative dielectric constant of the SiOF film to about 3.3, although it is very difficult, in terms of the stability of the film, to lower the relative dielectric constant of the SiOF insulating film to a level lower than 3.3. On the other hand, it may be possible to lower the relative dielectric constant of the SOG film or the insulating film having a low dielectric constant, such as an organic resin film, to about 2.0. Such being the situation, the development of the technology for forming these films is being vigorously pursued.

However, low dielectric constant insulating films are also low density, and are brittle, leading to low mechanical strength films. To be more specific, an oxide film formed by the conventional CVD method has a modulus of elasticity of about 70 GPa. On the other hand, the modulus of elasticity of the insulating film having a low dielectric constant, i.e., the insulating film having a relative dielectric constant not higher than 3.0, is markedly lowered to 6 GPa or less. It follows that it is very difficult to use an insulating film having a low dielectric constant in large regions of a semiconductor device as a low dielectric constant interlayer insulating film, which is included in a multi-layered wiring structure having five or more layers and used in a high performance semiconductor device.

BRIEF SUMMARY OF THE INVENTION

A method for forming an insulating layer according to one embodiment of the present invention comprises:

coating a substrate with an insulating film material to form a coated film, the insulating film material containing at least first and second polymers differing from each other in average molecular weight; and heating the coated film while irradiating the coated film with an electron beam.

A method for manufacturing a semiconductor device according to another embodiment of the present invention comprises:

coating a semiconductor substrate having an element formed therein with an insulating film material to form a coated film, the insulating film material containing at least first and second polymers differing from each other in average molecular weight; and heating the coated film while irradiating the coated film with an electron beam to form an insulating film having a low dielectric constant.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

DETAILED DESCRIPTION OF THE INVENTION

One embodiment of the present invention will now be described with reference to FIGS. 1 to 3.

Figure 1:
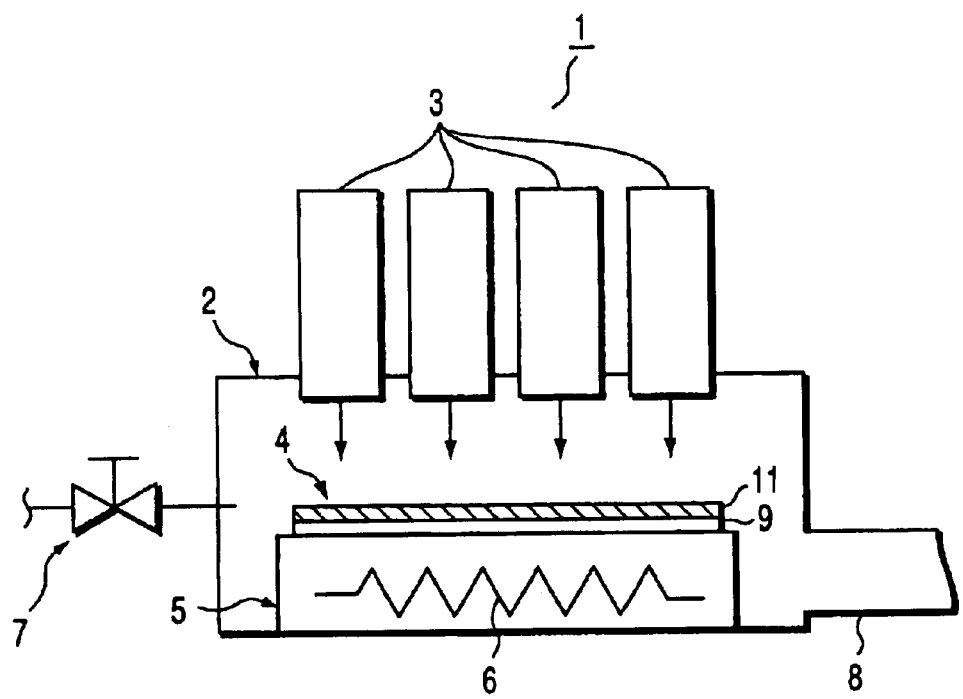
FIG. 1 schematically shows the construction of a heat treating apparatus used in the method of forming an insulating film according to one embodiment of the present invention.

FIG. 1 shows the construction of a heat treating apparatus 1 used in the method according to one embodiment of the present invention. As shown in the drawing, the heat treating apparatus 1 comprises a process chamber 2 for baking a coated film formed on a semiconductor substrate 9, so as to form an insulating film 11 having a low dielectric constant. Four electron beam irradiating sources 3, each capable of emitting an electron beam (EB) toward the entire surface of the coated film, noted above, are arranged in an upper portion of the process chamber 2. The entire surface of the coated film is irradiated with the electron beam emitted from the electron beam irradiating sources 3. Also, a sample holder 5 for supporting the semiconductor substrate 9 is arranged within the process chamber 2 below the four electron beam irradiating sources 3. The sample holder 5 is arranged as a hot plate having a heating means (Joule heating) 6 arranged therein for heating the coated film formed on the semiconductor substrate 9. The insulating film 11 having a low dielectric constant is formed by heating the coated film formed on the semiconductor substrate 9 by using the hot plate, while irradiating the coated film with the electron beam from the electron beam irradiating sources 3.

In baking the coated film for forming the insulating film 11 having a low dielectric constant, it is possible to introduce a desired gas into the process chamber 2 by using a gas introducing valve 7 and a gas supply device (not shown). In baking the coated film for forming the insulating film 11 having a low dielectric constant, it is also possible to set the inside of the process chamber 2 at an atmosphere of a predetermined reduced pressure by using a vacuum exhaust port 8. Arranged downstream of the vacuum exhaust port 8 are an opening-closing valve (not shown), a pressure adjusting device (not shown), and an exhaust pump (not shown), etc., for maintaining the inside of the process chamber 2 at a predetermined pressure. The insulating film 11 is formed by the method of one embodiment of the present invention, by using the heat treating apparatus 1 of the construction described above.

The method of forming an insulating film in this embodiment comprises coating the substrate with an insulating film material to form a coated film, said insulating film material containing at least first and second polymers differing from each other in average molecular weight, and heating said coated film while irradiating said coated film with an electron beam.

Figure 2:
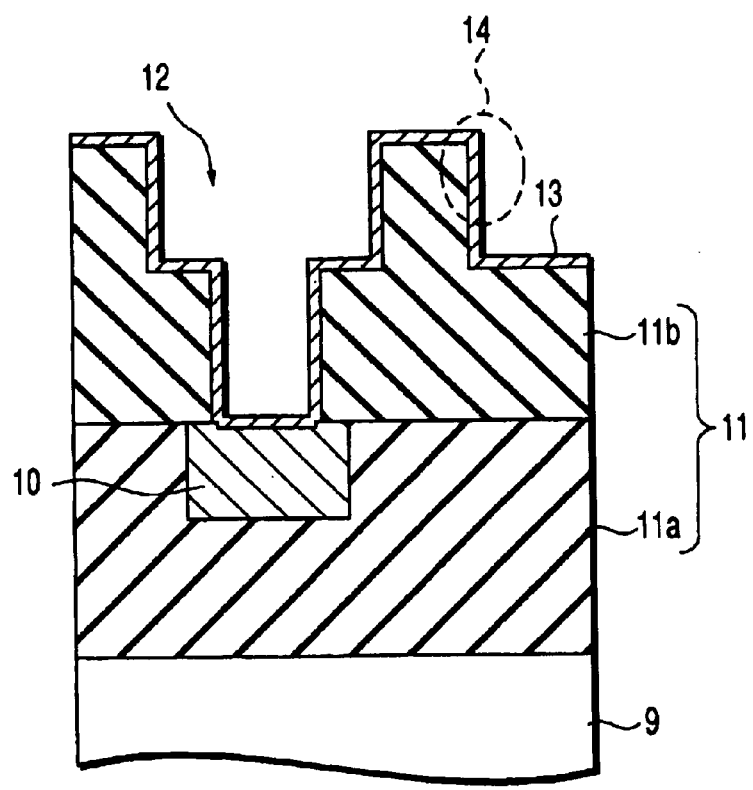
FIG. 2 is a cross sectional view showing a wiring groove formed in an insulating film formed by the method according to one embodiment of the present invention.
Figure 3:
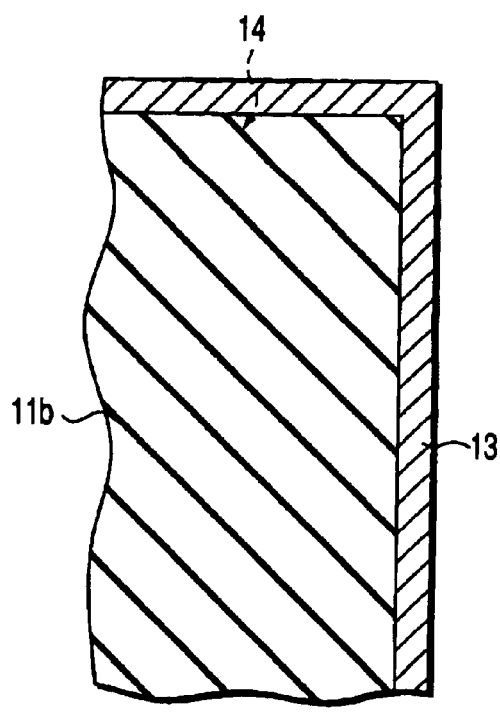
FIG. 3 is a cross sectional view showing, in a magnified fashion, the side wall portion of the wiring groove shown in FIG. 2.

The method in this embodiment can be employed for forming a second insulating film 11b having a low dielectric constant on a first insulating film 11a having a low dielectric constant, as shown in, for example, FIG. 2. An element (not shown) is formed in advance in the semiconductor substrate 9. A buried wiring 10, containing Cu as a main component, is formed in the first insulating film 11a having a low dielectric constant. The method in this embodiment can also be employed for forming the particular insulating film 11a having a low dielectric constant.

In the first step, the first insulating film 11a having a low dielectric constant is coated by a spin coating method with a material of the second insulating film 11b having a low dielectric constant, so as to form a thin film having a substantially uniform thickness.

For forming the second insulating film 11b having a low dielectric constant, a material is used that contains at least first and second polymers differing from each other in average molecular weight. By mixing at least first and second polymers differing from each other in average molecular weight, it is possible to increase the mechanical strength of the low dielectric constant insulating film. The low dielectric constant insulating film thus formed has a mechanical strength about 1.5 times as high as that of the low dielectric constant insulating film formed by using a material containing single polymer. Particularly, it is desirable to use first and second polymers, said first polymer having an average molecular weight at least 100 times as high as that of the second polymer. For example, it is desirable to use mixed polymers comprising the first polymer having an average molecular weight of 2,000,000 and the second polymer having an average molecular weight of 2,000. It is possible to use a varnish prepared by dissolving, for example, polymethyl silsesquioxane (MSQ) in a solvent as the insulating film material.

In the first step, the low dielectric constant insulating film 11a is coated by a spin coating method with the varnish containing a polymer noted above so as to form a coated film having a substantially uniform thickness. Then, the semiconductor substrate 9 having the coated film formed thereon is put on the hot plate for heating the coated film at 50 to 150° C. for 1 to 10 minutes, e.g., at about 100° C. for about 2 minutes, followed by heating the coated film at 150 to 250° C. for 1 to 10 minutes, e.g., at about 200° C. for about 2 minutes. The solvent or the like contained in the coated film is removed by evaporation by the stepwise heating of the coated film. As a result, the components other than MSQ, such as the solvent contained in the coated film, are removed essentially completely, with the result that the coated film consisting essentially of MSQ is fixed to the first insulating film 11a having a low dielectric constant. Incidentally, the solvent can also be removed by putting the coated film under an atmosphere of a reduced pressure of about $1 \times 10^{-2}$ to 500 Torr.

After completion of the stepwise heating, the temperature of the coated film is elevated to a predetermined temperature by the hot plate in, for example, 60 seconds, so as to further heat the coated film. It is desirable for the heating in this step to be carried out at 250 to 450° C. for about 1 to 60 minutes. Where the heating temperature is excessively low or where the heating time is excessively short, it is difficult to perform the heating sufficiently. On the other hand, where the heating temperature is excessively high or where the heating time is excessively long, diffusion of Cu used as the wiring material and hillock generation tend to be promoted, with the result that it is difficult to form a high quality film in a short time and under a low temperature.

During the heating, the coated film is irradiated with an electron beam. Before irradiation with the electron beam, it is desirable to lower the pressure inside the process chamber 2 to about 1 to 500 Torr through the vacuum exhaust port 8 by operating the vacuum pump, and introducing an Ar gas into the process chamber 2 through the gas introducing valve 7 from the gas supply device. The flow rate of the Ar gas can be set at about 1 to 10 L/min, e.g., at about 3 L/min. Particularly, it is desirable to apply the electron beam irradiation under the state that the Ar gas atmosphere is set up within the process chamber 2 and the pressure inside the process chamber 2 is maintained at about 10 Torr via the vacuum exhaust port 8 by operating the pressure adjusting device and the vacuum pump. If the heating is carried out under a nitrogen gas atmosphere, the coated film tends to be nitrided. Also, if the heating is carried out under an air atmosphere or under an oxygen atmosphere, the coated film tends to be oxidized. Such being the situation, it is most desirable to carry out the heating under an Ar gas atmosphere because the heating under an Ar gas atmosphere does not bring about the inconvenience noted above and the heating cost is low.

The electron beam irradiating source 3 emits an electron beam with an irradiating energy of a predetermined magnitude imparted thereto. As denoted by arrows in FIG. 1, the entire surface of the coated film is irradiated with the electron beam emitted from the electron beam irradiating source 3. The electron beam emitted from the electron beam irradiating source 3 has an energy of about 1 to 50 keV, and it is possible to set the dose of the electron beam irradiating the coated film substantially constant at about 100 to 2,000 $\mu C/cm^2$, e.g., at about 1,000 $\mu C/cm^2$. Also, the irradiating time can be set at about 1 to 60 minutes, e.g., at about 30 minutes. Where the dose is excessively low, or where the irradiating time is excessively short, it is difficult to obtain a sufficient effect of the electron beam irradiation. On the other hand, where the dose is excessively high or where the irradiating time is excessively long, film shrinkage proceeds, which increases the stress, leading to the occurrence of cracks. Other problem such as an increase in the relative dielectric constant or an increase in the hygroscopicity may be brought about.

The effect of the one embodiment of the present invention can be obtained if the coated film is irradiated uniformly with an electron beam having the energy noted above at the dose noted above. The method of forming an electron beam and the number of electron beam irradiating sources are not particularly limited.

A fixed coated film is irradiated with an electron beam. If a coated film, which is not fixed, is irradiated with an electron beam, it is possible for the components other than MSQ such as the solvent contained in the coated film to be denatured so as to impair the characteristics of the formed insulating film having a low dielectric constant. Such an inconvenience can be prevented by removing the solvent in advance by evaporation. In other words, it is possible to remove undesired components, such as solvent, when forming an MSQ film, so as to provide the second insulating film 11b having a low dielectric constant and exhibiting desired characteristics.

An energy, which cannot be imparted by the heating treatment alone, can be applied to the coated film if the heat treatment is applied to the coated film in combination with the electron beam irradiation. As a result, the crosslinking reaction of the polymer contained in the coated film proceeds effectively, or the molecular chain or the atomic groups, which cannot be cut away by the heat energy alone, can be cut away.

Where the electron beam irradiation is carried out, the crosslinking reaction among the molecules, the cutting of the molecular chain and the separation of the atomic groups are caused to take place simultaneously. The proportion of the crosslinking reaction, etc., which are caused by the electron beam irradiation, is dependent on the kind of the molecules of the material. By applying the electron beam irradiation and the heat treatment in combination, the crosslinking reaction further proceeds even if the molecular chain is cut or the atomic groups are separated. Specifically, where the molecular chain is cut or the atomic groups are separated, the cutting point provides a new crosslinking point, so as to permit the crosslinking reaction to further proceed.

As described above, the crosslinking reaction among the polymer molecules can be performed together with the cutting of the molecular chain and the separation of the atomic groups, which cannot be carried out by the application of the heat treatment alone, by applying the electron beam irradiation during the heat treatment. It is possible for the condensation reaction or the polymerization reaction to take place not only between the same polymer molecules equivalent in the average molecular weight, but also between the polymer molecules differing from each other in the molecular weight. In the insulating film having a low dielectric constant thus formed, the fine structure is rendered uniform so as to form a structure differing from that of an insulating film having a low dielectric constant formed by heat treatment alone. It follows that it is possible to obtain an interlayer insulating film having a low dielectric constant and substantially uniform film quality by using a mixture of first and second polymers differing from each other in average molecular weight, e.g., a mixture of a polymer having an average molecular weight of 2,000,000 and another polymer having an average molecular weight of 2,000.

An MSQ film having a high mechanical strength and a uniform film quality is formed in this fashion as the second interlayer insulating film 11b having a low dielectric constant on the first interlayer insulating film 11a having a low dielectric constant.

The MSQ film formed by the method in this embodiment has a relative dielectric constant of about 2.5 to 3.0, which is considerably lower than the relative dielectric constant (about 3.9 to 4.1) of a conventional $SiO_2$ film formed by the CVD method. It is highly possible for the MSQ film thus formed to be sufficient for use in a high speed, high performance semiconductor device.

In addition, the MSQ film formed in this embodiment is formed by using a raw material containing first and second polymers differing from each other in average molecular weight and by heating the raw material while irradiating the raw material film with an electron beam, with the result that the MSQ film formed has a high mechanical strength. For example, the MSQ film formed by the method in this embodiment by using a raw material containing first and second polymers, the first polymer having an average molecular weight at least 100 times as high as that of the second polymer, was found to have a modulus of elasticity of about 9 GPa.

Incidentally, the MSQ film formed by using a raw material containing a single kind of polymer and by applying a heat treatment alone was found to have a modulus of elasticity of about 4 GPa. The mechanical strength of the MSQ film thus formed is very low, compared with that of an $SiO_2$ film formed by the CVD method, which exhibits a modulus of elasticity of about 70 GPa. The MSQ film formed by the method in this embodiment has a mechanical strength at least two times as high as that of the MSQ film formed by using a raw material containing a single kind of polymer and, thus, fully withstands practical use.

The semiconductor substrate 9 having the second MSQ film of a low dielectric constant with a high modulus of elasticity, as pointed out above, formed on the first MSQ film, is taken to the outside of the process chamber 2 to further subject it to an etching treatment and a CMP treatment. For example, a wiring groove 12 and a via hole are formed in the second insulating film 11b having a low dielectric constant by dry etching, followed by forming a barrier metal layer 13 on the entire surface, as shown in FIG. 2. FIG. 3 shows a magnified portion of a side wall 14 surrounded by a broken line in FIG. 2. It has been found that a concave portion was not formed at all in the wiring groove 12 because the second insulating film 11b having a low dielectric constant was uniform in film quality, with the result that the barrier metal layer 13 was formed with uniform thickness. Where Cu is deposited, in the subsequent step, on the barrier metal layer 13 for forming a wiring layer and a plug, it is substantially impossible for a defective Cu leakage to be generated in the second insulating film 11b having a low dielectric constant.

The method of the present invention for forming an insulating film and the method of the present invention for manufacturing a semiconductor device are not limited to the embodiment described above. It is possible to modify the method of the present invention in various ways within the technical scope of the present invention.

For example, an effect similar to that described above can be obtained in the case of applying the technical idea of the present invention to the formation of a single layer insulating film having a low dielectric constant, or to the formation of a multi-layered insulating film comprising three or more layers and having a low dielectric constant. Also, the insulating film having a low dielectric constant, which is formed by applying a heat treatment while employing an electron beam irradiation, is not limited to an MSQ film. For example, it is possible to use an organic resin film having a low dielectric constant, such as a polyarylene ether film, or a polyimide film, as the raw material, as long as the raw material contains at least first and second polymers differing from each other in average molecular weight. It was possible to obtain the similar effect in the case of using such a material for forming the coated film and applying a heat treatment and an electron beam irradiation to the coated film thus formed. It is desirable to use a same kind of polymer for forming the organic resin film, although it is possible to use different kinds of polymers in combination. It is also possible to use the raw material of the organic resin film and the precursor of MSQ in combination. Further, it was possible to obtain a similar effect in the case of using a raw material containing at least first, second and third polymers differing from each other in average molecular weight.

For comparison, an insulating film having a low dielectric constant and comprising an MSQ film was formed by the method described above, except that the electron beam irradiation was not applied during the heat treatment. The raw material used in this experiment was prepared by mixing a polymer having an average molecular weight of 2,000,000 with another polymer having an average molecular weight of 2,000. Further, when a wiring groove and a via hole were formed by applying a dry etching, an irregularity was formed at a period of about 10 nm on the surface of the insulating film having a low dielectric constant after the processing. It is considered reasonable to understand that a clearance was formed among a plurality of polymers having a high molecular weight, and that the clearance thus formed was not sufficiently filled with polymers having a low molecular weight, giving rise to irregularities on the surface of the insulating film having a low dielectric constant. To be more specific, it is considered reasonable to understand that a difference in the etching rate was derived from the non-uniformity in the film quality, giving rise to irregularities on the surface of the insulating film having a low dielectric constant after the dry etching process. It is also possible for such an irregularity to be generated on the surface of the insulating film having a low dielectric constant after the CMP process.

Figure 4:
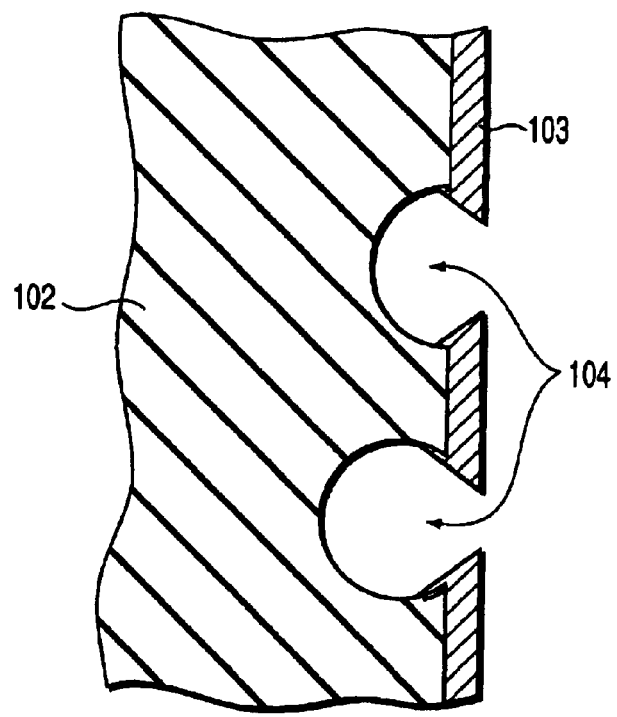
FIG. 4 is a cross sectional view showing in a magnified fashion the side wall portion of the wiring groove included in an insulating film formed without employing the irradiation with an electron beam.

A barrier metal layer was formed on the entire surface of the insulating film having a low dielectric constant and having a wiring groove and a via hole formed therein. FIG. 4 shows in a magnified fashion the side wall of the wiring groove having the barrier metal layer formed thereon. As shown in the drawing, concave portions 104, derived from the nonuniformity of the film quality, were formed in the side surface of the insulating film 102 having a low dielectric constant, after the dry etching process. It is possible for the irregular region to cause defects derived from the barrier characteristics, such as leakage of a Cu wiring (not shown), formed in the subsequent step on the barrier metal layer 103.

Additional advantages and modifications will readily occur to those skilled in the art. Therefore, the present invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method for forming an insulating layer, comprising:
coating a substrate with an insulating film material to form a coated film, said insulating film material containing at least first and second polymers differing from each other in average molecular weight, said first polymer having an average molecular weight at least 100 times as high as that of said second polymer; and
heating said coated film while irradiating said coated film with an electron beam.

2. The method for forming an insulating layer according to claim 1, wherein said coated film is heated at 50 to 150° C. for 1 to 10 minutes, followed by further heating the coated film at 150 to 250° C. for 1 to 10 minutes, prior to the heating of the coated film while irradiating the coated film with the electron beam.

3. The method for forming an insulating layer according to claim 1, wherein said coated film is arranged in an atmosphere of a reduced pressure of $1 \times 10^{-2}$ to 500 Torr prior to the heating of the coated film while irradiating the coated film with the electron beam.

4. The method for forming an insulating layer according to claim 1, wherein the irradiating amount of said electron beam falls within a range of between 100 and 2,000 $\mu C/cm^2$.

5. The method for forming an insulating layer according to claim 1, wherein the heating performed while irradiating the coated film with the electron beam is carried out under a reduced pressure falling within a range of between 1 and 500 Torr.

6. The method for forming an insulating layer according to claim 1, wherein the heating performed while irradiating the coated film with the electron beam is carried out under an Ar gas atmosphere.

7. The method for forming an insulating layer according to claim 1, wherein the heating performed while irradiating the coated film with the electron beam is carried out at 250 to 450° C. for 1 to 60 minutes.

8. The method for forming an insulating layer according to claim 1, wherein said insulating film has a siloxane bond having a methyl group as a main skeleton.

9. The method for forming an insulating layer according to claim 1, wherein said insulating film is formed of an organic resin.

10. The method for forming an insulating layer according to claim 1, wherein said first and second polymers are the same kind of polymers.

11. A method for manufacturing a semiconductor device, comprising:

coating a semiconductor substrate having an element formed therein with an insulating film material to form a coated film, said insulating film material containing at least first and second polymers differing from each other in average molecular weight, said first polymer having an average molecular weight at least 100 times as high as that of said second polymer; and heating said coated film while irradiating said coated film with an electron beam to form an insulating film having a low dielectric constant.

12. The method for manufacturing a semiconductor device according to claim 11, wherein said coated film is heated at 50 to 150° C. for 1 to 10 minutes, followed by further heating the coated film at 150 to 250° C. for 1 to 10 minutes, prior to the heating of the coated film while irradiating the coated film with the electron beam.

13. The method for manufacturing a semiconductor device according to claim 11, wherein said coated film is arranged in an atmosphere of a reduced pressure of $1 \times 10^{-2}$ to 500 Torr prior to the heating of the coated film while irradiating the coated film with the electron beam.

14. The method for manufacturing a semiconductor device according to claim 11, wherein the irradiating amount of said electron beam falls within a range of between 100 and 2,000 $\mu C/cm^2$.

15. The method for manufacturing a semiconductor device according to claim 11, wherein the heating performed while irradiating the coated film with the electron beam is carried out under a reduced pressure falling within a range of between 1 and 500 Torr.

16. The method for manufacturing a semiconductor device according to claim 11, wherein the heating performed while irradiating the coated film with the electron beam is carried out under an Ar gas atmosphere.

17. The method for manufacturing a semiconductor device according to claim 11, wherein the heating performed while irradiating the coated film with the electron beam is carried out at 250 to 450° C. for 1 to 60 minutes.

18. The method for manufacturing a semiconductor device according to claim 11, wherein said insulating film having a low dielectric constant has a siloxane bond having a methyl group as a main skeleton.

19. The method for manufacturing a semiconductor device according to claim 11, wherein said insulating film having a low dielectric constant is formed of an organic resin.

20. The method for manufacturing a semiconductor device according to claim 11, further comprising:

forming at least one of a wiring groove and a hole in said insulating film having a low dielectric constant; and burying a Cu layer in at least one of said wiring groove and said hole with a barrier metal layer interposed therebetween.

21. The method for manufacturing a semiconductor device according to claim 11, wherein said first and second polymers are the same kind of polymers.

* * * * *